United States Patent [19]

Takai et al.

[11] Patent Number: 5,777,473
[45] Date of Patent: Jul. 7, 1998

[54] MAGNETIC RESONANCE IMAGING APPARATUS

[75] Inventors: Hiroshi Takai, Tochigi-ken; Yoshimori Kassai, Otawara, both of Japan

[73] Assignee: Kabushiki Kaisha Toshiba, Kanagawa-Ken, Japan

[21] Appl. No.: 637,550

[22] Filed: Apr. 25, 1996

[30] Foreign Application Priority Data

Apr. 28, 1995 [JP] Japan ................................. 7-106322

[51] Int. Cl.$^6$ ........................................... G01V 3/00
[52] U.S. Cl. ................................. 324/309; 324/322
[58] Field of Search ......................... 324/300, 306, 324/307, 309, 314, 318, 322

[56] References Cited

U.S. PATENT DOCUMENTS 5,017,870  5/1991  Kasugai et al. ........................ 324/318
5,038,784  8/1991  Dumoulin ............................... 324/306

OTHER PUBLICATIONS

"Breath–Hold MR Cholangiopancreatography with a Long–Echo–Train Fast Spin–Echo Sequence and a Surface Coil in Chronic Pancreatitis" Yasuo Takehara et al.; Radiology 1994; 192:73–78.

*Primary Examiner*—Louis M. Arana
*Attorney, Agent, or Firm*—Limbach & Limbach LLP

[57] ABSTRACT

In specific magnetic resonance imaging, magnetization spins are repeatedly excited by excitation pulses, and echoes are repeatedly generated after each of the excitation pulses. The echoes so generated are acquired as echo signals. Based on these echo signals, image data is reconstructed. According to the present invention, the number of times the magnetization spins are excited by the excitation pulses is input by an operator and, based on this input number, the number of echoes generated by one excitation is determined. Image-pickup time can easily be computed on the basis of the number of times of excitation and the time required for repeating fixed excitation pulses. The operator is able to easily control the image-pickup time by controlling the input number of times of excitation.

6 Claims, 9 Drawing Sheets

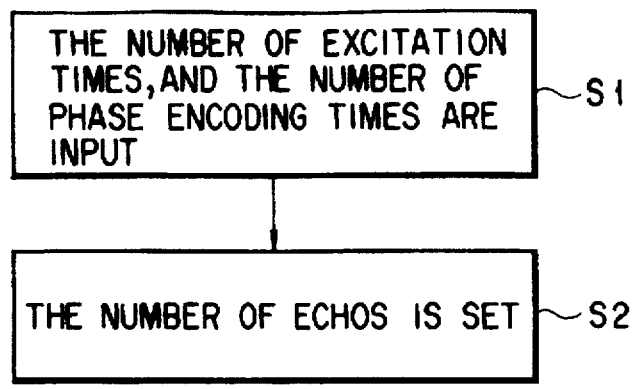
F I G. 2
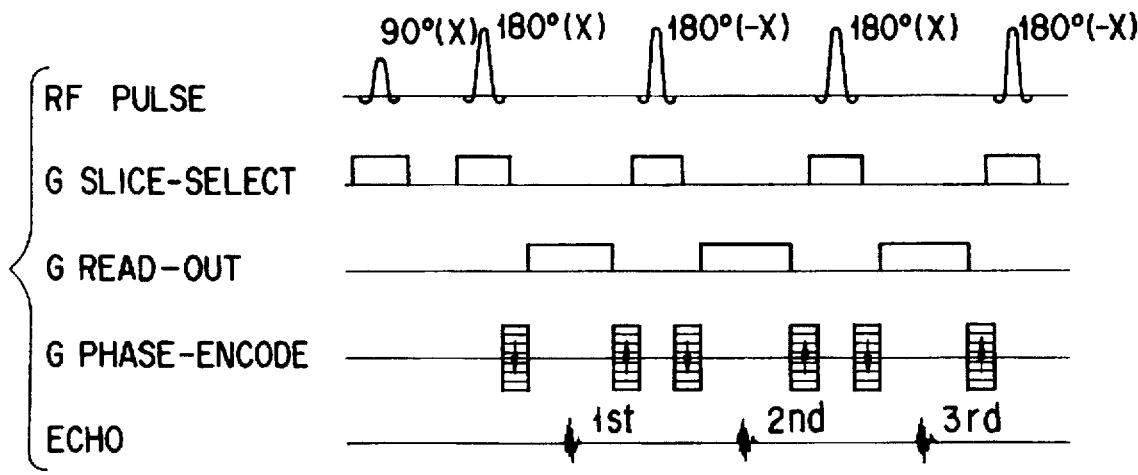
F I G. 3
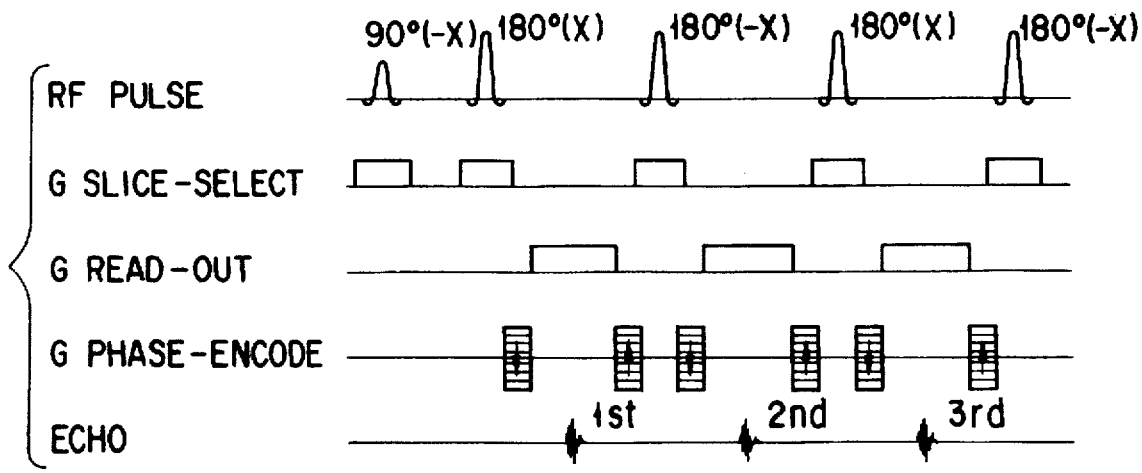
F I G. 4

| RF PULSES | | 90° | 180° | 1st | 180° | 2nd | 180° | 3rd | 180° | 4th | 180° | 5th |
|---|---|---|---|---|---|---|---|---|---|---|---|---|
| ECHO | | | | | | | | | | | | |
| PHASE | ODD-NUMBERED EXCITATION | x | x | | -x | | x | | -x | | x | |
| | EVEN-NUMBERED EXCITATION | -x | x | | -x | | x | | -x | | x | |
| OUTPUT-POLARITY OF ADC | ODD-NUMBERED EXCITATION | | | − | | + | | − | | + | | − |
| | EVEN-NUMBERED EXCITATION | | | + | | − | | + | | − | | + |
| INPUT-SIGNAL POLARITY TO ADC | ODD-NUMBERED EXCITATION (ECHO / FID / DC) | | | − + + | | + − + | | − + + | | + − + | | − + + |
| | EVEN-NUMBERED EXCITATION (ECHO / FID / DC) | | | + + + | | − − + | | + + + | | − − + | | + + + |
| OUTPUT-SIGNAL POLARITY FROM ADC | ODD-NUMBERED EXCITATION (ECHO / FID / DC) | | | + − − | | − + − | | + − − | | + − + | | + − − |
| | EVEN-NUMBERED EXCITATION (ECHO / FID / DC) | | | + + + | | + + − | | + + + | | + + − | | + + + |
| AVERAGED SIGNAL-POLARITY | ECHO / FID / DC | | | + o o | | + o o | | + o o | | + o o | | + o o |

FIG. 5

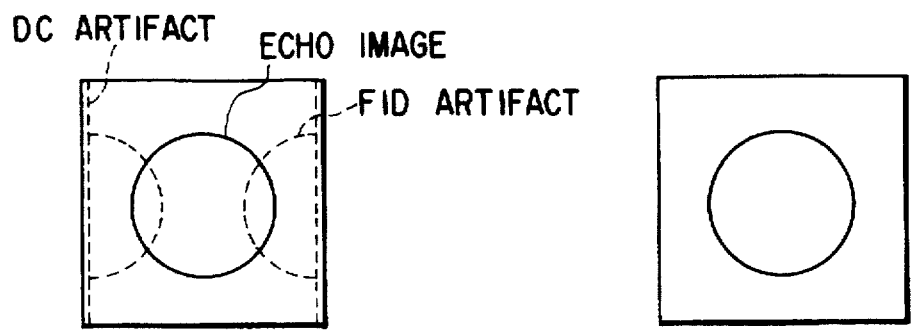
FID ARTIFACT ; SHIFTED, NOT REDUCTED
DC ARTIFACT ; SHIFTED, NOT REDUCTED
FIG. 6
FID ARTIFACT ; REDUCTED
DC ARTIFACT ; REDUCTED
FIG. 7
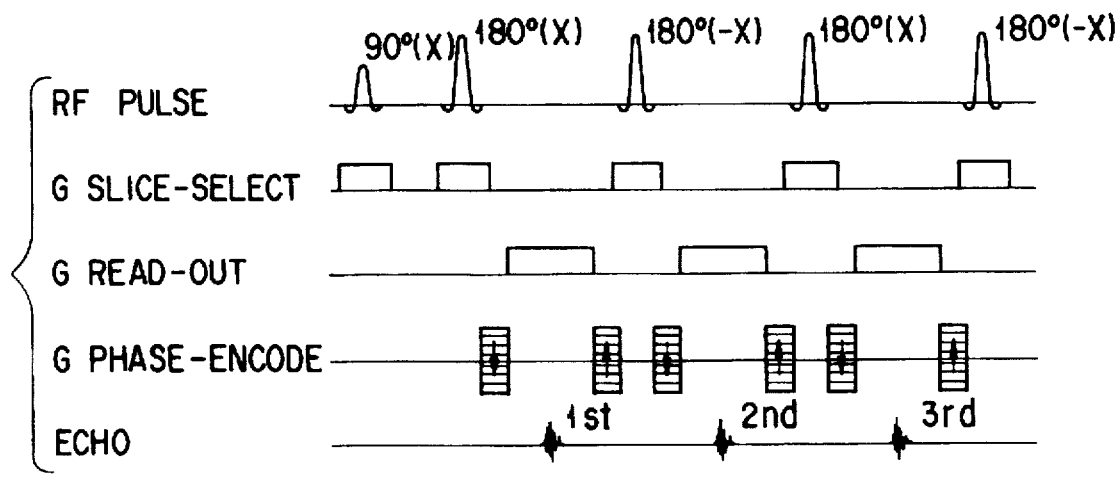
FIG. 8
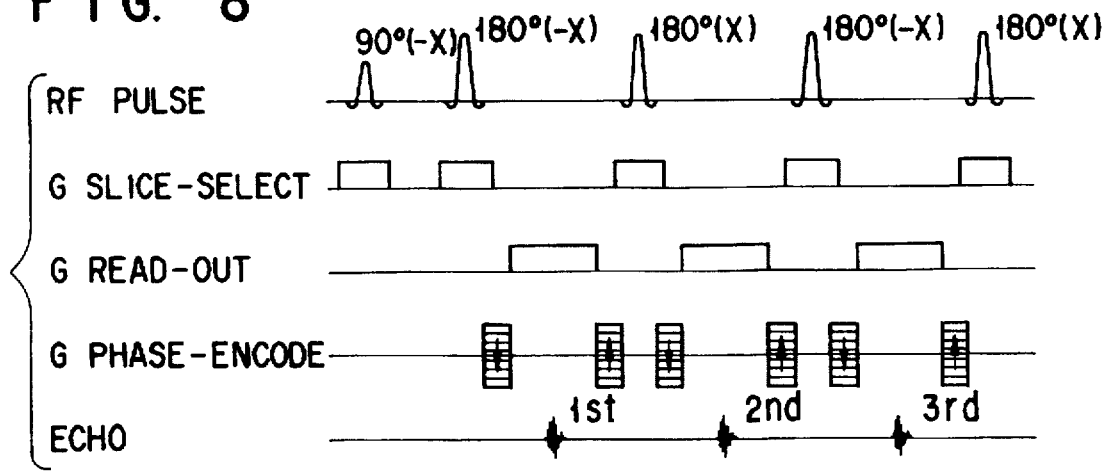
FIG. 9

| RF PULSES | | 90° | 180° | 1st | 180° | 2nd | 180° | 3rd | 180° | 4th | 180° | 5th |
|---|---|---|---|---|---|---|---|---|---|---|---|---|
| ECHO | | | | | | | | | | | | |
| PHASE | ODD-NUMBERED EXCITATION | x | x | | -x | | x | | -x | | x | |
| | EVEN-NUMBERED EXCITATION | -x | -x | | x | | -x | | x | | -x | |
| OUTPUT-POLARITY OF ADC | ODD-NUMBERED EXCITATION | | | − | | + | | − | | + | | − |
| | EVEN-NUMBERED EXCITATION | | | + | | − | | + | | − | | + |
| INPUT-SIGNAL POLARITY TO ADC | ODD-NUMBERED EXCITATION ECHO FID DC | | | − + + | | + − + | | − + + | | + − + | | − + + |
| | EVEN-NUMBERED EXCITATION ECHO FID DC | | | + − + | | − + + | | + − + | | − + + | | + − + |
| OUTPUT-SIGNAL POLARITY FROM ADC | ODD-NUMBERED EXCITATION ECHO FID DC | | | + − − | | + − + | | + − − | | + − + | | + − − |
| | EVEN-NUMBERED EXCITATION ECHO FID DC | | | + − + | | + − − | | + − + | | + − − | | + − + |
| AVERAGED SIGNAL-POLARITY | ECHO FID DC | | | + − 0 | | + − 0 | | + − 0 | | + − 0 | | + − 0 |

F I G. 10

| RF PULSES | | 90° | 180° | ECHO 1st | 180° | 2nd | 180° | 3rd | 180° | 4th | 180° | 5th |
|---|---|---|---|---|---|---|---|---|---|---|---|---|
| PHASE | ODD-NUMBERED EXCITATION | X | Y | | Y | | Y | | Y | | Y | |
| | EVEN-NUMBERED EXCITATION | -X | Y | | Y | | Y | | Y | | Y | |
| OUTPUT-POLARITY OF ADC | ODD-NUMBERED EXCITATION | | | + | | + | | + | | + | | + |
| | EVEN-NUMBERED EXCITATION | | | − | | − | | − | | − | | − |
| INPUT-SIGNAL-POLARITY TO ADC | ODD-NUMBERED EXCITATION ECHO FID DC | | | + + + | | + + + | | + + + | | + + + | | + + + |
| | EVEN-NUMBERED EXCITATION ECHO FID DC | | | − + + | | − + + | | − + + | | − + + | | − + + |
| OUTPUT-SIGNAL-POLARITY FROM ADC | ODD-NUMBERED EXCITATION ECHO FID DC | | | + + + | | + + + | | + + + | | + + + | | + + + |
| | EVEN-NUMBERED EXCITATION ECHO FID DC | | | + − − | | + − − | | + − − | | + − − | | + − − |
| AVERAGED SIGNAL-POLARITY | ECHO FID DC | | | + 0 0 | | + 0 0 | | + 0 0 | | + 0 0 | | + 0 0 |

FIG. 15

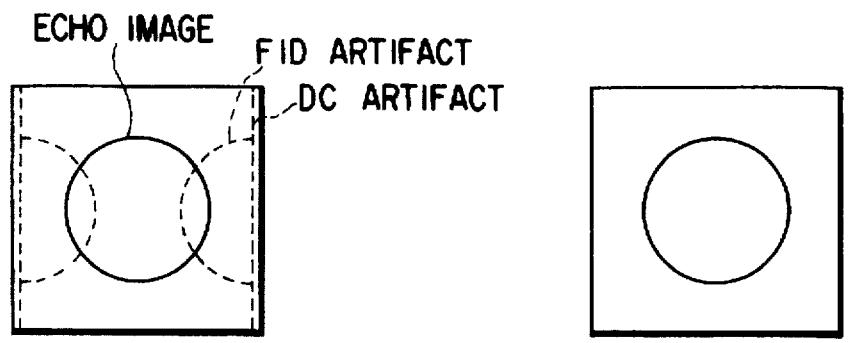
FID ARTIFACT ; SHIFTED, NOT REDUCTED
DC ARTIFACT ; SHIFTED, NOT REDUCTED
FID ARTIFACT ; REDUCTED
DC ARTIFACT ; REDUCTED
F I G. 16    F I G. 17
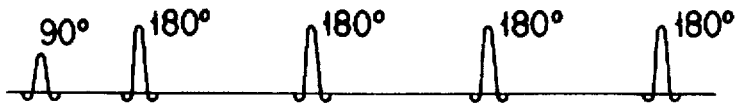
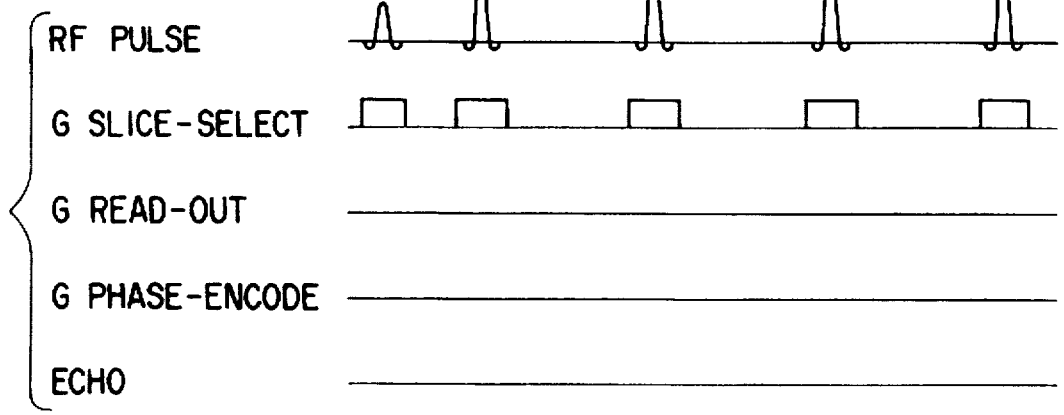
F I G. 18
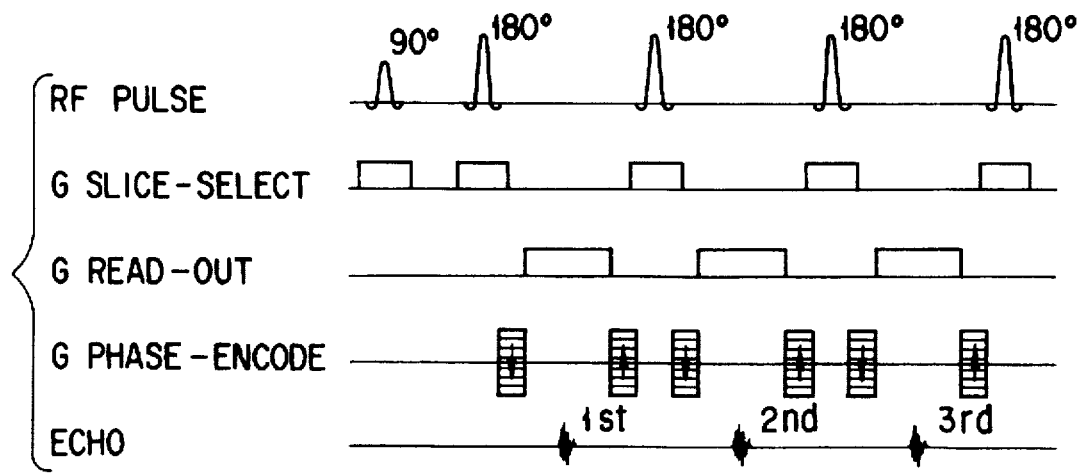
F I G. 19

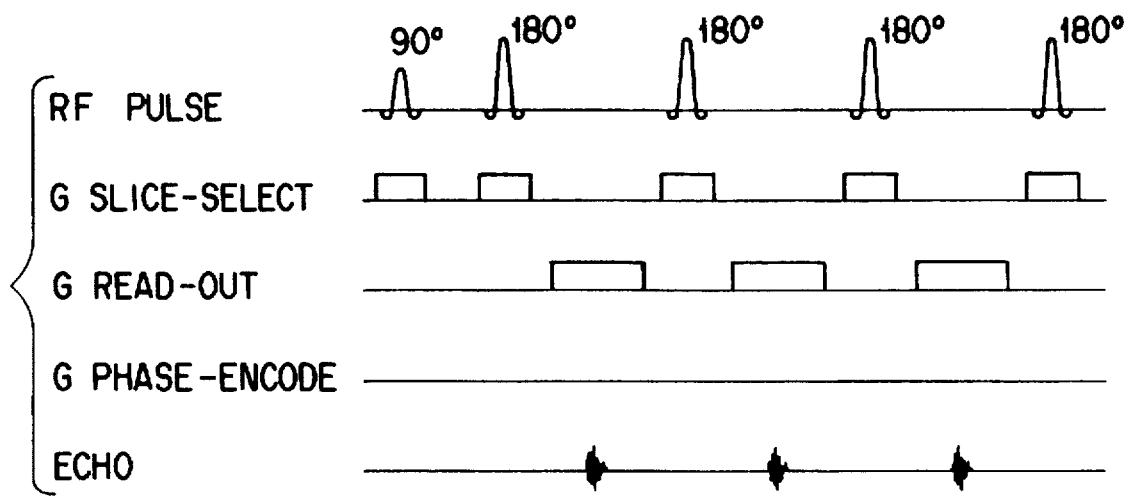
F I G. 20

MAGNETIC RESONANCE IMAGING APPARATUS

BACKGROUND OF THE INVENTION

1. Field of the Invention

The present invention relates to a magnetic resonance imaging apparatus capable of generating a plurality of echoes by a single excitation.

2. Description of the Related Art

Recently a Fast Spin Echo (F-SE) method and an Echo Planar Imaging (EPI) method have been developed and put to practical use.

In the F-SE method, magnetization spins are excited by a radiofrequency magnetic field pulse (excitation pulse) whose flip angle is 90°, and a radiofrequency magnetic field pulse (refocus pulse) having a flip angle of 180° is repeatedly generated. The phases of the magnetization spins are therefore repeatedly focused, as are a plurality of echoes.

In the EPI method, magnetization spins are first excited by an excitation pulse. A gradient magnetic field for de-phasing the magnetization spins is then generated and immediately another gradient magnetic field for in-phasing the magnetization spins is generated with a polarity opposite to that of the former gradient magnetic field. An echo or a gradient echo is thus generated. If the magnetization spins are alternately de-phased and in-phased, a plurality of echoes are generated.

It is greatly expected that the EPI method will be applied to breath-holding image pickup and cardiac image pickup since echo data necessary for reconstructing image data of one frame can be acquired in several seconds or several milliseconds. The time required for acquiring such echo data is defined as image-pickup time T.

If the repetition time of almost fixed excitation pulses is represented as TR, and the number of times of excitation of excitation pulses (the number of shots) is expressed as Nexcite, the image-pickup time T is given by the following equation:

$$T = TR \times Nexcite \qquad (1)$$

If the number of echoes (echo number) acquired by one excitation is expressed as Necho, and the number of times of phase encoding (phase encoding number) is indicated as Nencode, the number Nexcite is given by the following equation:

$$Nexcite = Nencode/Necho \qquad (2)$$

From the above equations (1) and (2), the following equation (3) is obtained:

$$T = TR \times (Nencode/Necho) \qquad (3)$$

The image-pickup time T, which is in inverse proportion to the phase encoding number Nencode and in proportion to the echo number Necho, is shortened, whereas the space resolution is proportionate to the phase encoding number Nencode and improved. Consequently, there is a tradeoff relationship between the space resolution and time resolution with respect to the phase encoding number Nencode.

In the cardiac image pickup for picking up an image of a heart which moves relatively fast, the time resolution is considered to be more important than the space resolution, while in a part moving relatively slowly, the space resolution has priority over the time resolution. For this reason, it is essential for an operator to control the time resolution and space resolution in accordance with a target part whose image is to be picked up and an objective of image pickup.

A prior art magnetic resonance imaging apparatus is so constructed that an operator can input the echo number (Necho) and the phase encoding number (Nencode). The operator is able to grasp the space resolution directly from the phase encoding number Nencode; however, he or she cannot directly catch the time resolution or image-pickup time T. This is because the image-pickup time T is obtained by computing the equations (2) and (3) in sequence, based on the echo number Necho and phase encoding number Nencode.

As described above, in the prior art apparatus, it is very difficult to control the space resolution and time resolution between which there is a tradeoff relationship.

Furthermore, high-speed imaging has the following drawback which is related to the extension of image-pickup time. Since the high-speed imaging is a technique of continuously acquiring echo data, phase errors are increased and accumulated. It is thus very important to correct the phase errors. The phase errors are due to a shift of the actual echo peak timing from a computed one, the shift being caused by irregularities of a magnetostatic field. The correction of phase errors is defined as an operation of matching the computed echo peak timing with the actual one. For this correction, the actual echo peak timing has to be measured.

Before the main pulse sequence for acquiring echo data necessary for reconstructing image data, its similar pre-pulse sequence should be executed to measure the echo peak timing. Consequently, the image-pickup time is virtually extended by the time required for the pre-pulse sequence.

SUMMARY OF THE INVENTION

An object of the present invention is to provide a magnetic resonance imaging apparatus which facilitates the control between time resolution and space resolution.

Another object of the present invention is to provide a magnetic resonance imaging apparatus capable of shortening image-pickup time.

According to a first aspect of the present invention, there is provided a magnetic resonance imaging apparatus comprising:

means for repeatedly exciting magnetization spins by excitation pulses;

means for repeatedly generating echoes after each of the excitation pulses;

means for acquiring the echoes generated by the generating means, as echo signals;

means for reconstructing image data based on the echo signals acquired by the acquiring means;

means for inputting the number of times of excitation the magnetization spins are excited by the excitation pulses; and means for determining the number of echoes generated by one excitation based on the number of times of excitation input by the inputting means.

According to a second aspect of the present invention, there is provided a magnetic resonance imaging apparatus comprising:

means for repeatedly exciting magnetization spins by excitation pulses;

means for repeatedly generating refocus pulses after each of the excitation pulses to repeatedly generate echoes from the magnetization spins after each of the excitation pulses;

means for acquiring the echoes generated by the generating means, as echo signals, the acquiring means being constituted such that output polarities of the echo signals are switchable, the echo signals each having echo components and noise components;

means for averaging a pair of echo signals, the pair of echo signals being acquired after each of continuous excitation pulses, having the same echo time, and being provided with the same phase encode information;

means for reconstructing image data based on the echo signals averaged by the averaging means; and means for controlling a phase of each of the excitation pulses, a phase of each of the refocus pulses, and an output polarity of each of the echo signals.

According to a third aspect of the present invention, there is provided a magnetic resonance imaging apparatus comprising:

means for repeatedly exciting magnetization spins by excitation pulses;

means for repeatedly generating echoes after each of the excitation pulses;

means for acquiring the echoes generated by the generating means, as echo signals;

means for computing phase correction data in response to at least one of the echo signals acquired after a first excitation pulse;

means for correcting the echo signals acquired after each of the excitation pulses subsequent to the first excitation pulse based on the phase correction data; and means for reconstructing image data based on the echo signals corrected by the correcting means.

The present invention fulfills the following first function. In specific magnetic resonance imaging, magnetization spins are repeatedly excited by excitation pulses, and echoes are repeatedly generated after each of the excitation pulses. The echoes so generated are acquired as echo signals. Based on these echo signals, image data is reconstructed. According to the present invention, the number of times the magnetization spins are excited by the excitation pulses, is input by an operator and, based on this input number, the number of echoes generated by one excitation is determined. Image-pickup time can easily be computed on the basis of the number of times of excitation and the time required for repeating fixed excitation pulses. The operator is able to easily control the image-pickup time by controlling the input number of times of excitation.

The present invention fulfills the following second function. Refocus pulses are repeatedly generated after each of excitation pulses, and echoes are repeatedly generated from magnetization spins after each of the excitation pulses. The echoes so generated are acquired as echo signals. Each of the echo signals contains echo components and noise components. The noise components include direct current components and free induction damping components. A pair of echo signals is averaged. These echo signals, which are acquired after each of two continuous excitation pulses, have the same echo time and are provided with the same phase encode information. Based on the averaged echo signals, image data is reconstructed. Both the direct current components and free induction damping components can be reduced by appropriately controlling a phase of each excitation pulse, that of each refocus pulse, and an output polarity of acquiring means.

The present invention fulfills the following third function. Magnetization spins are repeatedly excited by excitation pulses, and echoes are repeatedly generated after each of the excitation pulses. The echoes so generated are acquired as echo signals. Phase correction data is computed in response to at least one echo signal acquired after a first excitation pulse is generated. Based on the phase correction data, the echo signals acquired after each of excitation pulses subsequent to the first excitation pulse. Based on the corrected echo signals, image data is reconstructed. None of the echo signals acquired after the first excitation pulse are employed for reconstruction of image data. In other words, the first excitation pulse is generated as a so-called dummy shot for contrast correction. In the prior art apparatus, no echoes are acquired after a first excitation pulse is generated. However, in the present invention, the echoes are acquired after the first excitation pulse, and the acquired echoes are used for calculation of phase correction data. The echoes for calculation of phase correction data are acquired as dummy shots for contrast correction. It is thus unnecessary to execute the pre-pulse sequence for acquiring echoes for calculation of phase correction data, which are conventionally executed before a dummy shot; accordingly, image-pickup time can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 2 is a flowchart showing a process of determining the number of echoes by a computer system;

FIG. 3 is a chart of a pulse sequence corresponding to odd-numbered excitation in the first mode;

FIG. 4 is a chart of a pulse sequence corresponding to even-numbered excitation in the first mode;

FIG. 5 is a table indicating states of echo components, FID components and direct current components at respective stages of a process from acquisition of signals to averaging thereof in the first mode;

FIG. 6 is a view of a reconstructed image corresponding to an original signal in the first mode;

FIG. 7 is a view of a reconstructed image corresponding to a signal averaged in the first mode;

FIG. 8 is a chart of a pulse sequence corresponding to odd-numbered excitation in the second mode;

FIG. 9 is a chart of a pulse sequence corresponding to even-numbered excitation in the second mode;

FIG. 10 is a table indicating states of echo components, FID components and direct current components at respective stages of a process from acquisition of signals to averaging thereof in the second mode;

FIG. 15 is a table indicating states of echo components, FID components and direct current components at respective stages of a process from acquisition of signals to averaging thereof in the third mode;

FIG. 16 is a view of a reconstructed image corresponding to an original signal in the third mode;

FIG. 17 is a view of a reconstructed image corresponding to a signal averaged in the third mode;

FIG. 18 is a view of a conventional blank shot pulse sequence;

FIG. 19 is a view of a main pulse sequence; and

FIG. 20 is a view of a blank shot pulse sequence according to the present invention.

DETAILED DESCRIPTION OF THE PREFERRED EMBODIMENTS

A magnetic resonance imaging apparatus according to an embodiment of the present invention will now be described with reference to the accompanying drawings.

Figure 1:
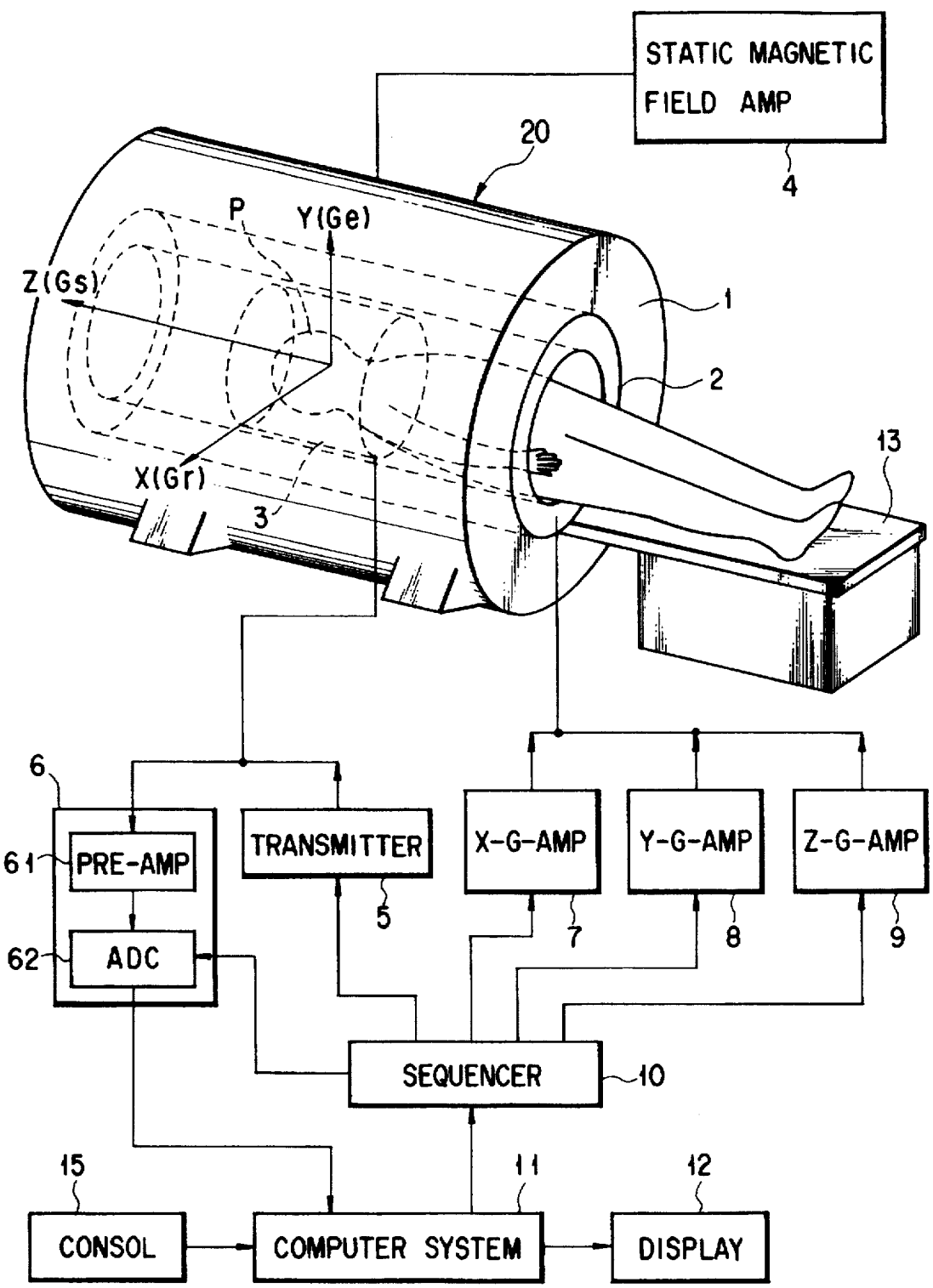
FIG. 1 is a view showing the constitution of a magnetic resonance imaging apparatus according to a preferred embodiment of the present invention.

FIG. 1 illustrates the constitution of the magnetic resonance imaging apparatus. The apparatus includes a coil assembly 20 having a magnetostatic field magnet 1, a gradient coil set 2, and a radiofrequency coil 3. The magnet 1 generates a magnetostatic field upon reception of current from a magnetostatic power supply 4. The magnetostatic field is set in the Z direction. The gradient coil set 2, which includes three pairs of coils applied to their respective X, Y and Z directions, receives currents from gradient magnetic field amplifiers (G-AMP) 7, 8 and 9 corresponding to the X, Y and Z direction, and generates X-, Y- and Z-gradient magnetic fields corresponding thereto. These X-, Y- and Z-gradient magnetic fields arbitrarily correspond to a read-out gradient magnetic field (Gread-out), a phase-encode magnetic field (Gphase-encode), and a slice gradient magnetic field (Gslice).

A bed 13 is inserted into an internal image-pickup area of the coil assembly 20 with a subject P thereon.

Upon receiving a radiofrequency current from a transmitter 5, the radiofrequency coil 3 generates a radiofrequency magnetic field pulse. A receiver 6 receives a magnetic resonance signal from magnetization spins through the radiofrequency coil 3. The radiofrequency coil 3 can be replaced with a set of radiofrequency coils for transmission and reception. The receiver 6 includes a preamplifier 61 and an analog digital converter (ADC) 62. The ADC 62 is so constructed that its output polarity can be switched from positive to negative or from negative to positive in response to a control signal from a sequencer 10.

A computer system 11 computes phase correction data based on echo data output from the receiver 6 and corrects a phase of the echo data based on the computed phase correction data. Then the computer system 11 reconstructs image data by two-dimensional Fourier transform processing (2DFT) on the basis of the phase-corrected echo data. The image data is displayed on a display 12.

The console 15 is provided in order that an operator can input the number of times of generation of radiofrequency magnetic field pulses for excitation (excitation number or shot number), and the number of times of phase encoding (phase encoding number) to the computer system 11. The system 11 determines the number of echoes (echo number), generated by one excitation, based on both the input excitation number and the input phase encoding number.

The sequencer 10 supplies a control signal to each of the transmitter 5, receiver 6, and gradient magnetic field amplifiers 7, 8 and 9 in order to execute a pulse sequence according to the excitation number, phase encoding number, and echo number supplied from the computer system 11.

FIG. 2 shows a process of determining the number of echoes by the computer system 11. An operator operates the console 15 to input the number of times of excitation (excitation number Nexcite) and the number of times of phase encoding (phase encoding number Nencode) to the computer system 11 (step S1).

Based on these numbers Nexcite and Nencode in the computer system 11, the number of echoes Necho is determined in accordance with the following equation (4) (step S2).

$$Necho = Nencode/Nexcitey \quad (4)$$

Adopting a so-called half phase encoding technique of acquiring data of half the Fourier space and creating data of the remaining half thereof using complex conjugate, the number of echoes Necho is determined based on the following equation (5). In this equation, Ncontrast represents the phase encoding number close to zero encode which is dominant over image contrast.

$$Necho = \{(Nencode + Ncontrast)/2\}/Nexcite \quad (5)$$

If the result of Necho is not an integral number, the Necho is set the nearest integral number to the result, larger than the result.

The pulse sequences of F-SE and EPI methods are executed by the sequencer 10 in accordance with excitation number Nexcite, phase encoding number Nencode and echo number Necho. In other words, the radiofrequency magnetic field pulses for excitation (excitation pulses) are generated repeatedly by the number corresponding to the excitation number Nexcite at a cycle of predetermined repetition time TR. After the excitation pulses are generated, echoes are generated repeatedly by the echo number Necho.

Image-pickup time T is given by a product of repetition time TR and excitation number Nexcite according to the foregoing equation (1). The operator is able to understand time resolution directly from the operator's input excitation number Nexcite and also understand space resolution directly from the operator's input phase encoding number Nencode. It is thus easy to control the time resolution and space resolution.

The reduction of noise components will now be described. The signal supplied from the receiver 6 to the computer system 11 contains not only echo components but also noise components. To reduce noise, only the echo components are removed from the signal to decrease the noise components. The noise components include relatively stable direct current components (DC components) caused by white noise of the receiver 6 and relatively unstable free induction damping signal components (FID components) caused by phase inverting characteristics of radiofrequency magnetic field pulses (refocus pulses) having a flip angle of 180°. In this embodiment, there are three operation modes for the noise reduction.

(First Mode)

FIG. 3 shows a pulse sequence corresponding to odd-numbered excitation, and FIG. 4 does a pulse sequence corresponding to even-numbered excitation. The first mode is applied to a CP (Carr-Purcell) method. In this method, as shown in FIGS. 3 and 4, a radiofrequency magnetic field pulse (excitation pulse) having a flip angle of 90° is first generated, thus exciting magnetization spins. Then radiofrequency magnetic field pulses (refocus pulses) each having a flip angle of 180° are generated repeatedly, and the phases of the magnetization spins are focused repeatedly to generate a plurality of echoes. The refocus pulses are referred to as a first refocus pulse, a second refocus pulse, a third refocus pulse, . . . in order of generation, while the echoes are referred to as a first echo, a second echo, a third echo, . . . in order of generation.

In the pulse sequence shown in FIG. 3, the phase of the excitation pulse is set to (+X), that of the first refocus pulse is set to (+X), and that of the second refocus pulse is set to (–X). The phases of the plural refocus pulses are therefore alternately inverted between (+X) and (–X).

In the pulse sequence shown in FIG. 4, the phase of the excitation pulse is shifted from that of the odd-numbered excitation pulse by 180° and set to (–X). As in the case of the pulse sequence shown in FIG. 3, the phase of the first refocus pulse is set to (+X), and that of the second refocus pulse is set to (–X). Therefore, the phases of the plural refocus pulses are also alternately inverted between (+X) and (–X).

FIG. 5 shows switching of polarities of signals output from an analog digital converter (ADC) 62 in the first mode. The polarities of signals output from the receiver 6 depend upon the original polarities of the signals and the polarities of the signals output from the ADC 62.

In the odd-numbered excitation, the output signal polarity of the ADC 62 is set to (–) for the first echo and (+) for the second echo. Thus, the output signal polarities of the ADC 62 are alternately switched between (–) and (+) for the plural echoes in order of generation.

In the even-numbered excitation, the output signal polarity of the ADC 62 is set to (+) for the first echo and (–) for the second echo. Thus, the output signal polarity of the ADC 62 is set opposite to that in the odd-numbered excitation for each of the echoes.

In the odd-numbered and even-numbered excitations, the polarities of echo components, FID components and DC components are varied by the ADC 62, as shown in FIG. 5.

In the output signals from the ADC, the echo components have the same polarity in the odd-and even-numbered excitations, whereas the polarities of FID components in the odd-and even-numbered excitations are opposite to each other and so are those of DC components. The echo, FID and DC components are supplied from the receiver 6 to the computer system 11.

The computer system 11 averages a pair of echoes corresponding to consecutive two excitations. These paired echoes have the same time period from generation of the excitation pulse to the echo peak, that is, the same echo time. In other words, one of the echoes is the n-th echo generated after the odd-numbered excitation, and the other echo is the n-th echo generated after the even-numbered excitation immediately after the odd-numbered excitation. The paired echoes are provided with the same phase encode information.

Since the echo components of one of the paired echoes and those of the other echo are of the same polarity, they are simply averaged. As regards the FID components and DC components of the paired echoes, the polarities in one of the echoes and those in the other echo are opposite to each other; therefore, in this case, these components are offset and at least decreased by averaging.

The computer system 11 reconstructs image data based on an averaged signal. FIG. 6 illustrates an image reconstructed in response to an original signal not averaged, while FIG. 7 does an image reconstructed in response to an averaged signal. The remaining FID and DC components appear as artifacts on the reconstructed image as shown in FIG. 6, but the FID and DC components reduced by averaging do not appear as artifacts thereon (FIG. 7).

(Second Mode)

FIG. 8 shows a pulse sequence corresponding to odd-numbered excitation, and FIG. 9 does a pulse sequence corresponding to even-numbered excitation. The second mode is also applied to the CP (Carr-Purcell) method.

In the pulse sequence shown in FIG. 8, the phase of the excitation pulse is set to (+X), that of the first refocus pulse is set to (+X), and that of the second refocus pulse is set to (–X). The phases of the plural refocus pulses are therefore alternately inverted between (+X) and (–X).

In the pulse sequence shown in FIG. 9, the phase of the excitation pulse is shifted from that of the odd-numbered excitation pulse by 180° and set to (–X). While the phase of the first refocus pulse is shifted from that of the odd-numbered first refocus pulse by 180° and set to (–X), that of the second refocus pulse is shifted from that of the odd-numbered second refocus pulse by 180° and set to (+X). Thus, the phases of the plural refocus pulses are shifted from their corresponding odd-numbered refocus pulses by 180°, and alternately inverted between (–X) and (+X).

FIG. 10 shows switching of polarities of signals output from the analog digital converter (ADC) 62 in the second mode.

In the odd-numbered excitation, the output signal polarity of the ADC 62 is set to (–) for the first echo and (+) for the second echo. Thus, the output signal polarities of the ADC 62 are alternately switched between (–) and (+) for the plural echoes in order of generation.

In the even-numbered excitation, the output signal polarity of the ADC 62 is set to (+) for the first echo and (–) for the second echo. Thus, the output signal polarities of the ADC 62 are set opposite to those in the odd-numbered excitation.

In the odd-numbered and even-numbered excitations, the polarities of echo components, FID components and DC components are varied by the ADC 62, as shown in FIG. 10.

In the output signals from the ADC 62, the echo components have the same polarity (+) in the odd and even-numbered excitations, and the FID components also have the same polarity (–) in the odd-and-even-numbered excitations, whereas the polarities of the DC components in the odd and even-numbered excitations are opposite to each other. The echo, FID and DC components are supplied from the receiver 6 to the computer system 11.

A pair of echoes is averaged by the computer system 11 as in the first mode. Since the echo components of one of the paired echoes and those of the other echo are of the same polarity, they are simply averaged. The same is true of the FID components. As regards the DC components of the paired echoes, the polarities in one of the echoes and those in the other echo are opposite to each other; therefore, in this case, these components are offset and at least decreased by averaging.

Figures 11, 12:
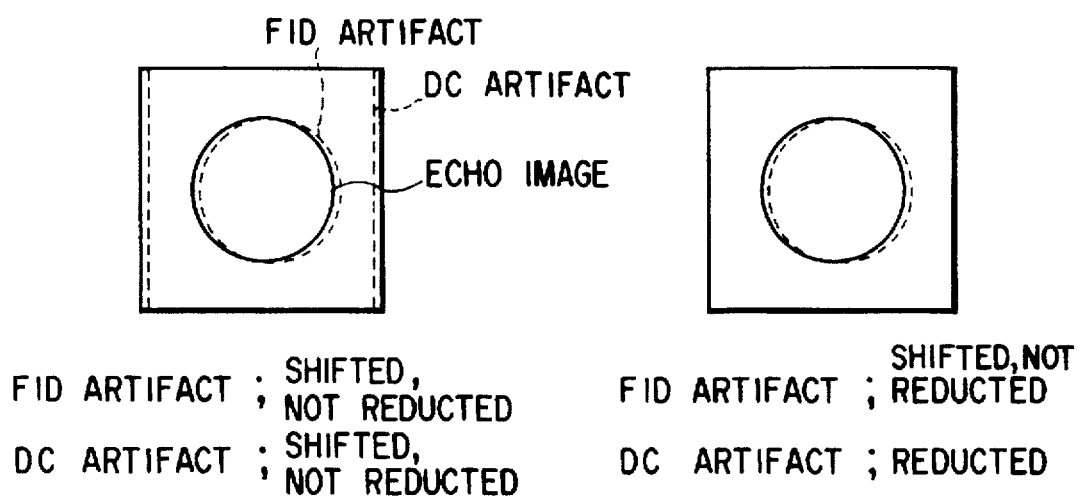
FIG. 11 is a view of a reconstructed image corresponding to an original signal in the second mode.
FIG. 12 is a view of a reconstructed image corresponding to a signal averaged in the second mode.

The computer system 11 reconstructs image data based on an averaged signal. FIG. 11 illustrates an image reconstructed in response to an original signal not averaged, while FIG. 12 does an image reconstructed in response to an averaged signal. When no averaging is executed as shown in FIG. 11, the FID and DC components appear as artifacts on the reconstructed image. As shown in FIG. 12, the DC components reduced by averaging do not appear as artifacts thereon, but the FID components not reduced by averaging appear as artifacts on the reconstructed image.

(Third Mode)

Figure 13:
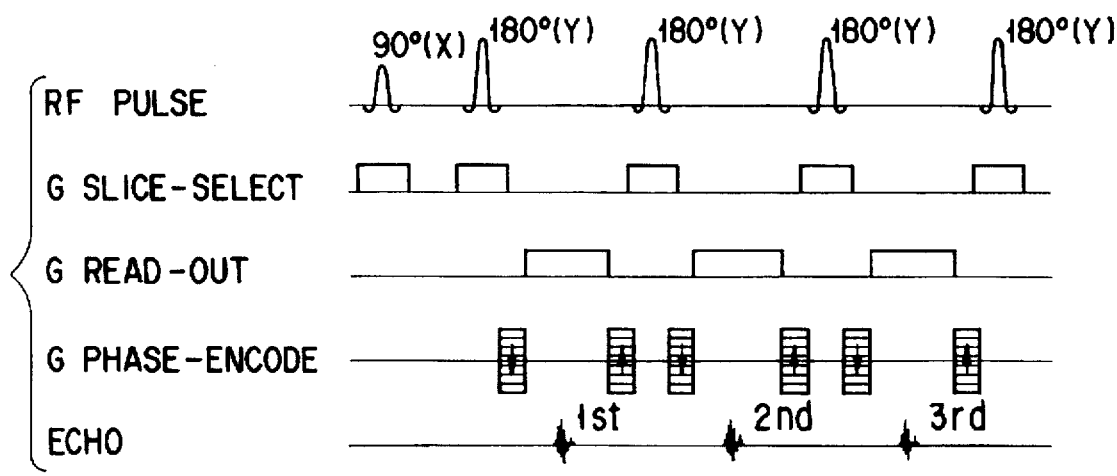
FIG. 13 is a chart of a pulse sequence corresponding to odd-numbered excitation in the third mode.
Figure 14:
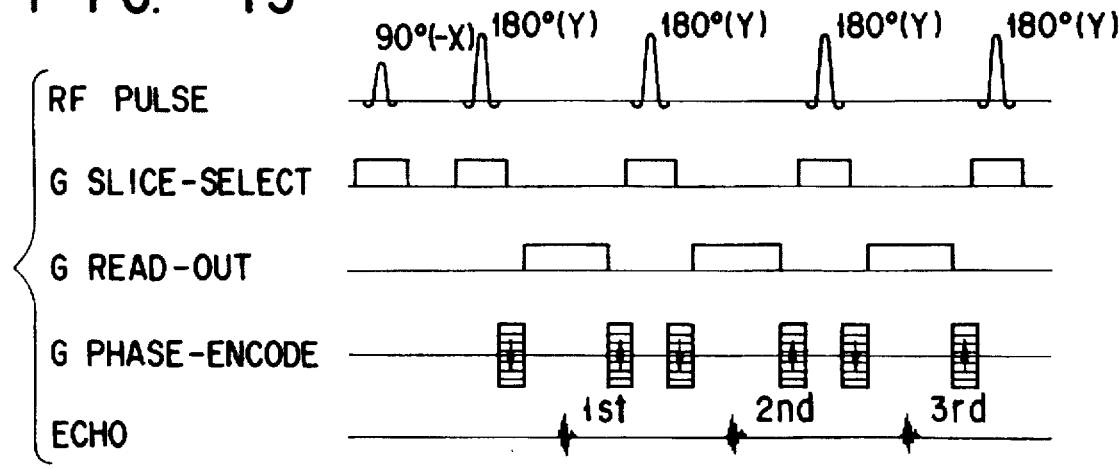
FIG. 14 is a chart of a pulse sequence corresponding to even-numbered excitation in the third mode.

FIG. 13 shows a pulse sequence corresponding to odd-numbered excitation, and FIG. 14 does a pulse sequence corresponding to even-numbered excitation. The third mode is applied to a CPMG (Carr-Purcell-Meiboom-Gill) method. According to the CPMG method, as in the foregoing CP method, a plurality of refocus pulses are repeatedly generated after an excitation pulse, with the result that the phases of magnetization spins are repeatedly focused, and a plurality of echoes are repeatedly generated. The CPMG method differs from the CP method in that the phase of each refocus pulse is shifted from that of the excitation pulse by 90°, and the refocus pulses are generated in the phase of Y.

In the pulse sequence shown in FIG. 13, the phase of the excitation pulse is set to (+X), and that of the first refocus pulse is set to (+Y), as is that of the second refocus pulse. The phases of the plural refocus pulses are therefore fixed to (+Y).

In the pulse sequence shown in FIG. 14, the phase of the excitation pulse is shifted from that of the odd-numbered excitation pulse by 180° and set to (−X). Like the phases of the odd-numbered refocus pulses, those of the even-numbered refocus pulses are set to (+Y).

FIG. 15 shows switching of polarities of signals output from the analog digital converter (ADC) 62 in the third mode. In the odd-numbered excitation, the output signal polarity of the ADC 62 is fixed to (+) for a plurality of echoes, whereas in the even-numbered excitation, the output signal polarity of the ADC 62 is fixed to (−) for the plurality of echoes.

In the odd-numbered and even-numbered excitations, the polarities of echo components, FID components and DC components are varied by the ADC 62, as shown in FIG. 15.

In the output signals from the ADC, the echo components have the same polarity (+) in the odd and even-numbered excitations, whereas the polarities of the FID components in the odd and even-numbered excitations are opposite to each other and so are those of the DC components. The echo, FID and DC components are supplied from the receiver 6 to the computer system 11.

A pair of echoes is averaged by the computer system 11 as in the first mode. Since the echo components of one of the paired echoes and those of the other echo are of the same polarity, they are simply averaged. As regards the FID and DC components of the paired echoes, the polarities in one of the echoes and those in the other echo are opposite to each other; therefore, in this case, these components are offset and at least decreased by averaging.

The computer system 11 reconstructs image data based on an averaged signal. FIG. 16 illustrates an image reconstructed in response to an original signal not averaged, while FIG. 17 does an image reconstructed in response to an averaged signal. When no averaging is executed as shown in FIG. 16, the FID and DC components appear as artifacts on the reconstructed image. As shown in FIG. 17, neither FID nor DC components reduced by averaging appear as artifacts thereon.

It is preferable that the above three modes be selected by an operator. One of the modes can be selected by the computer system 11 based on the number of times of averaging and the number of times of excitation. For example, when the number of times of averaging is an even one, the first or third mode is selected. When the number of times of averaging is an odd one and the number of times of excitation is an even one, the third mode is selected. When the number of times of averaging and the number of times of excitation are both odd ones, the second mode is selected.

Shortening of image-pickup time in the F-SE method, will now be described. As described in the above "Description of the Related Art," a pre-pulse sequence for measuring the actual echo peak timing needs to be executed prior to the main pulse sequence for acquiring echo data used for image reconstruction. According to the present invention, image-pickup time can be shortened by eliminating the pre-pulse sequence.

In the main pulse sequence, excitation is repeated; however, in general, a so-called "dummy shot" is performed for the first excitation or the first several excitations for contrast correction, and echoes generated by the excitation or excitations are not used for image reconstruction. This is because the first excitation is for magnetization spins in the initially steady state, and the second excitation and its following are for magnetization spins which are returning to their steady state. FIG. 18 shows a dummy-shot pulse sequence in the F-SE method, and FIG. 19 does a pulse sequence corresponding to the second excitation et seq. Since in the dummy shot no echoes are acquired, neither a read-out gradient magnetic field pulse (Gread-out) nor a phase encode gradient magnetic field (Gphase-encode), which is different from a slice select gradient magnetic field (Gslice-select), is generated. The dummy-shot pulse sequence is the same as that corresponding to the second excitation and its following, except that neither the read-out gradient magnetic field pulse nor phase encode gradient magnetic field is generated.

In the present invention, echo data is acquired, and phase correction data is computed based on the acquired data. Therefore, no pre-pulse sequence is required.

FIG. 20 shows a dummy-shot pulse sequence according to the embodiment of the present invention. In this pulse sequence, a read-out gradient magnetic field (Gread-out) is generated, and frequency encode information is provided to echo data, as in the pulse sequence corresponding to the second excitation and its following, but no phase encode gradient magnetic field (Gphase-encode) is generated or no phase encode information is provided to echo data, unlike in the pulse sequence corresponding to the second excitation and its following.

While the echo data acquired by the dummy-shot pulse sequence is represented as ft(kx), the echo data acquired by the pulse sequence corresponding to the second excitation and the following is expressed as f(kx), where kx indicates a position on a frequency axis in the Fourier space. The echo data ft(kx) and f(kx) are converted to Ft($\xi$, $\eta$) and F($\xi$, $\eta$), respectively by the inverse Fourier transform with respect to a kx axis. Ft($\xi$, $\eta$) is phase correction data. Ft($\xi$, $\eta$) and F($\xi$, $\eta$) are given by the following equations (6) and (7). In these equations, Re denotes a real part, and Im shows an imaginary part.

$$Ft(\xi, \eta) = Re(Ft) + i \cdot Im(Ft) \qquad (6)$$

$$F(\xi, \eta) = Re(F) + i \cdot Im(F) \qquad (7)$$

In accordance with the following equation (8), F'($\xi$, $\eta$) is phase-corrected based on Ft($\xi$, $\eta$).

The phase-corrected echo data is expressed as F'($\xi$, $\eta$).

$$F'(\xi, \eta) = \{Re(F) + i \cdot Im(F)\} \times \{Re(Ft) - i \cdot Im(Ft)\} \qquad (8)$$

As described above, according to the present invention, echo data for computing phase correction data are acquired in the dummy-shot pulse sequence. Thus, no pulse sequence is required, and image-pickup time is shortened.

The present invention is not limited to the above embodiment, but it is needless to say that various changes and modifications can be made.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:
   means for repeatedly exciting magnetization spins by excitation pulses;
   means for repeatedly generating echoes after each of the excitation pulses;
   means for acquiring the echoes generated by said generating means, as echo signals;
   means for reconstructing image data based on the echo signals acquired by said acquiring means;
   input means for receiving the number of times of excitation the magnetization spins are excited by the excitation pulses; and
   means for determining the number of echoes generated by one excitation based on the number of times of excitation received by said inputting means.

2. The apparatus according to claim 1, wherein said determining means determines the number of echoes based on both the number of times of excitation input by said inputting means, and the number of times of phase encoding necessary for reconstructing the image data.

3. The apparatus according to claim 2, wherein said determining means determines the number of echoes based on a result obtained by dividing the number of times of phase encoding by the number of times of excitation.

4. The apparatus according to claim 2, wherein said determining means determines the number of echoes in accordance with a formula:

$$\{(Nencode+Ncontrast)/2\}/Nexcite$$

where Nexcitation is the number of times of excitation, Nencode is the number of times of phase encoding, and Ncontrast is the number of times of phase encoding close to zero encode which is dominant over image contrast.

5. The apparatus according to claim 2, wherein the number of times of phase encoding is input by said inputting means.

6. The apparatus according to claim 1, wherein said determining means determines the number of echoes based on the number of times of excitation and a matrix size.

* * * * *